United States Patent
Yoo et al.

(10) Patent No.: US 9,711,787 B2
(45) Date of Patent: Jul. 18, 2017

(54) ANODE ACTIVE MATERIAL FOR LITHIUM SECONDARY BATTERY, PREPARATION METHOD THEREOF, AND LITHIUM SECONDARY BATTERY COMPRISING THE SAME

(71) Applicant: LG Chem, Ltd., Seoul (KR)

(72) Inventors: Jung Woo Yoo, Daejeon (KR); Won Jong Kwon, Daejeon (KR); Eui Yong Hwang, Daejeon (KR); Kil Sun Lee, Daejeon (KR); Je Young Kim, Daejeon (KR); Yong Ju Lee, Daejeon (KR)

(73) Assignee: LG Chem, Ltd. (KR)

( * ) Notice: Subject to any disclaimer, the term of this patent is extended or adjusted under 35 U.S.C. 154(b) by 271 days.

(21) Appl. No.: 14/168,138

(22) Filed: Jan. 30, 2014

(65) Prior Publication Data
US 2014/0154564 A1 Jun. 5, 2014

Related U.S. Application Data

(63) Continuation of application No. PCT/KR2013/010919, filed on Nov. 28, 2013.

(30) Foreign Application Priority Data

Nov. 30, 2012 (KR) .................. 10-2012-0138524
Nov. 27, 2013 (KR) .................. 10-2013-0145165

(51) Int. Cl.
*H01M 4/133* (2010.01)
*H01M 4/134* (2010.01)
(Continued)

(52) U.S. Cl.
CPC ............. *H01M 4/366* (2013.01); *C30B 11/12* (2013.01); *C30B 29/06* (2013.01); *C30B 29/602* (2013.01);
(Continued)

(58) Field of Classification Search
CPC ...... H01M 4/386; H01M 4/587; H01M 4/366; C30B 329/06; C30B 329/602; C30B 11/12
(Continued)

(56) References Cited

U.S. PATENT DOCUMENTS

2002/0164479 A1* 11/2002 Matsubara ............ H01M 4/362
428/367
2005/0136330 A1 6/2005 Mao et al.
(Continued)

FOREIGN PATENT DOCUMENTS

CN 1967910 A 5/2007
CN 101106192 A 1/2008
(Continued)

OTHER PUBLICATIONS

Kershaw, et al, "Structural Characterization of Coal-Tar and Petroleum Pitches." Energy & Fuels, vol. 7, No. 3, May 1, 1983, pp. 420-425, XP055204772, ISSN: 0887-0624, DOI 10.1021/ef00039a014.
(Continued)

*Primary Examiner* — Sean P Cullen
(74) *Attorney, Agent, or Firm* — Lerner, David, Littenberg, Krumholz & Mentlik, LLP

(57) ABSTRACT

Provided are an anode active material including carbon-based particles, silicon nanowires grown on the carbon-based particles, and a carbon coating layer on surfaces of the carbon-based particles and the silicon nanowires, and a method of preparing the anode active material. Since the anode active material of the present invention is used in a lithium secondary battery, physical bonding force between the carbon-based particles and the silicon nanowires may not (Continued)

FORM CARBON COATING LAYER USING AMORPHOUS CARBON (PITCH)

only be increased but conductivity may also be improved. Thus, lifetime characteristics of the battery may be improved.

17 Claims, 7 Drawing Sheets

(51) Int. Cl.
| | |
|---|---|
| *H01M 4/1393* | (2010.01) |
| *H01M 4/1395* | (2010.01) |
| *H01M 4/587* | (2010.01) |
| *C30B 29/06* | (2006.01) |
| *C30B 29/60* | (2006.01) |
| *H01M 4/36* | (2006.01) |
| *H01M 4/38* | (2006.01) |
| *C30B 11/12* | (2006.01) |
| *H01M 4/04* | (2006.01) |
| *H01M 4/13* | (2010.01) |
| *B82Y 30/00* | (2011.01) |
| *B82Y 40/00* | (2011.01) |

(52) U.S. Cl.
CPC .......... *H01M 4/386* (2013.01); *H01M 4/587* (2013.01); *B82Y 30/00* (2013.01); *B82Y 40/00* (2013.01); *H01M 4/0471* (2013.01); *H01M 4/13* (2013.01); *Y10S 977/762* (2013.01); *Y10S 977/948* (2013.01)

(58) Field of Classification Search
USPC ................. 429/211, 231.8; 427/77
See application file for complete search history.

(56) References Cited

U.S. PATENT DOCUMENTS

| | | | |
|---|---|---|---|
| 2007/0111102 A1 | 5/2007 | Inoue et al. | |
| 2008/0020282 A1 | 1/2008 | Kim et al. | |
| 2009/0029256 A1 | 1/2009 | Mah et al. | |
| 2009/0176151 A1 | 7/2009 | Kim | |
| 2010/0015514 A1* | 1/2010 | Miyagi | H01M 2/0287 429/129 |
| 2010/0136431 A1 | 6/2010 | Lee et al. | |
| 2010/0159331 A1 | 6/2010 | Lee et al. | |
| 2010/0261060 A1 | 10/2010 | Choy et al. | |
| 2010/0285359 A1 | 11/2010 | Hwang et al. | |
| 2010/0297502 A1* | 11/2010 | Zhu | H01M 4/134 429/231.8 |
| 2011/0051322 A1 | 3/2011 | Pushparaj et al. | |
| 2011/0070488 A1 | 3/2011 | West et al. | |
| 2012/0003540 A1 | 1/2012 | Nakano et al. | |
| 2012/0149551 A1 | 6/2012 | Gaillard et al. | |
| 2012/0258371 A1 | 10/2012 | Nakanishi et al. | |
| 2012/0328947 A1 | 12/2012 | Chou et al. | |
| 2013/0029226 A1 | 1/2013 | Noh et al. | |
| 2013/0089784 A1* | 4/2013 | Cho | H01M 4/133 429/213 |
| 2013/0136994 A1* | 5/2013 | Ma | H01M 4/0471 429/231.8 |
| 2014/0072876 A1 | 3/2014 | Pushparaj et al. | |
| 2014/0113191 A1* | 4/2014 | Nakamura | C01B 25/45 429/220 |

FOREIGN PATENT DOCUMENTS

| | | | | |
|---|---|---|---|---|
| CN | 101483234 A | 7/2009 | | |
| CN | 102598366 A | 7/2012 | | |
| CN | 102738440 A | 10/2012 | | |
| EP | 2509139 A1 | 10/2012 | | |
| EP | 2579365 A1 | 4/2013 | | |
| JP | H11343109 A | 12/1999 | | |
| JP | 2002-293517 A | 10/2002 | | |
| JP | 2004220910 A | 8/2004 | | |
| JP | 2005263616 A | 9/2005 | | |
| JP | 2005-272261 A | 10/2005 | | |
| JP | 2008-166013 A | 7/2008 | | |
| JP | 2009032693 A | 2/2009 | | |
| JP | 2010-251302 A | 11/2010 | | |
| JP | 2011-181452 A | 9/2011 | | |
| JP | 2012-506363 A | 3/2012 | | |
| JP | 2012-123909 A | 6/2012 | | |
| JP | 2012169300 A | 9/2012 | | |
| JP | WO 2012133566 A1 * | 10/2012 | ............ | C01B 25/45 |
| JP | 2012527735 A | 11/2012 | | |
| JP | 2013084601 A | 5/2013 | | |
| KR | 2004-0082876 A | 9/2004 | | |
| KR | 2008-0091883 A | 10/2008 | | |
| KR | 2008-0111809 A | 12/2008 | | |
| KR | 20100014933 A | 2/2010 | | |
| KR | 20100062297 A | 6/2010 | | |
| KR | 2010-0073506 A | 7/2010 | | |
| KR | 2010-0120919 A | 11/2010 | | |
| KR | 2012-0066349 A | 6/2012 | | |
| KR | 2012-0069704 A | 6/2012 | | |
| KR | 2012-0069730 A | 6/2012 | | |
| WO | 2010/135446 A1 | 11/2010 | | |
| WO | 2011-132961 A2 | 10/2011 | | |

OTHER PUBLICATIONS

Office Action from European Application No. 13 836 222.3, dated Jul. 31, 2015.

Search report from European Patent Application No. 13836222.3 dated Oct. 21, 2014.

International Search Report from PCT/KR2013/010919, dated Mar. 14, 2014.

International Search Report from PCT/KR2013/010922, dated Mar. 17, 2014.

Search Report from European Application No. 1383434.8 dated Sep. 24, 2014.

Khomenko, V.G. et al., "Lithium-ion batteries based on carbon-silicon-graphite composite anodes," Journal of Power Sources, 2007, vol. 165, No. 2, p. 598-608.

Weber, J. et al, "One-dimensional nanostructures: fabrication, characterisation and applications," International Materials Review, 2008, vol. 53, No. 4, p. 235-255.

Li, H. et al., "Enhancing the performances of Li-on batteries by carbon-coating: present and future," Chemical Communications, Nov. 28, 2011 (E.pub.), vol. 48, No. 9, p. 1201-1217.

Huang. R. et al, "Carbon-coated silicon nanowire array films for high-performance lithium-ion battery anodes," Applied Physics Letters, 2009, vol. 95, Article No. 133119.

\* cited by examiner

[Fig. 1]
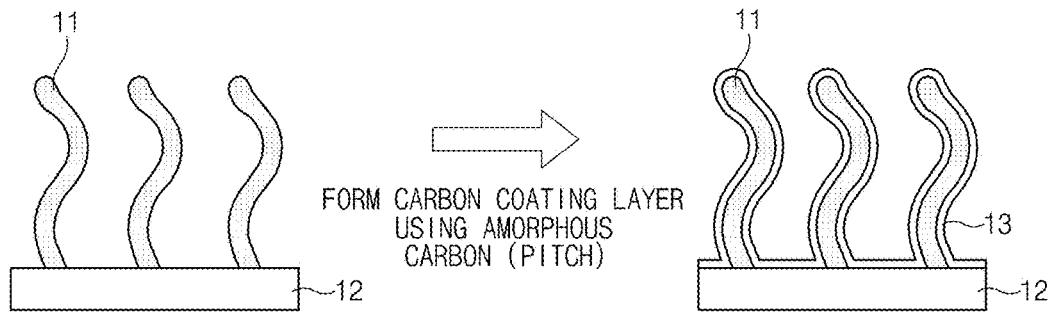
[Fig. 2]
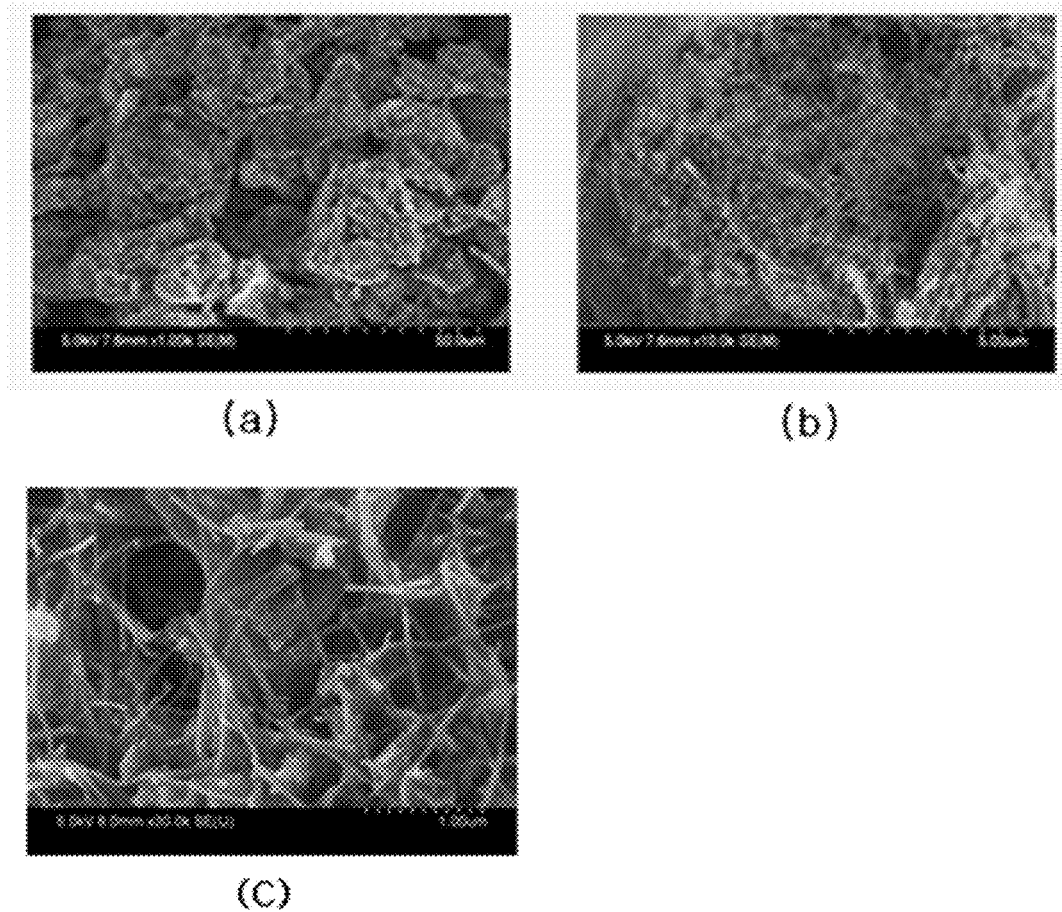
(a)    (b)
(c)

[Fig. 6]
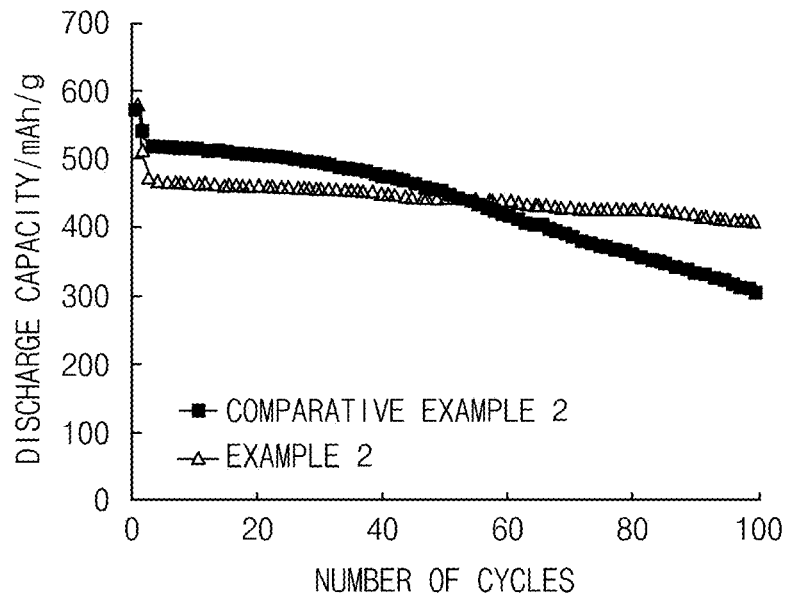
[Fig. 7]
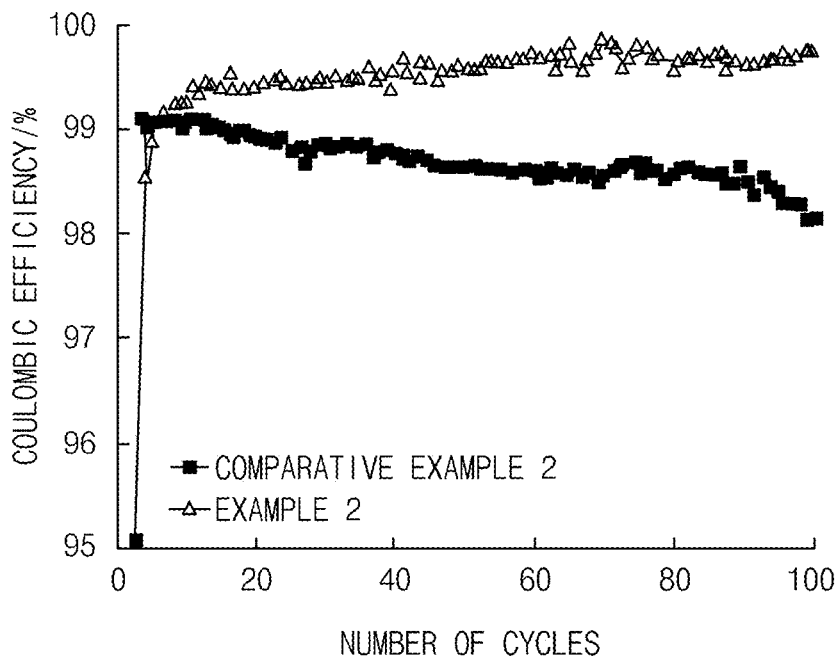

ANODE ACTIVE MATERIAL FOR LITHIUM SECONDARY BATTERY, PREPARATION METHOD THEREOF, AND LITHIUM SECONDARY BATTERY COMPRISING THE SAME

CROSS-REFERENCE TO RELATED APPLICATIONS

The present application is a continuation of International Application No. PCT/KR2013/010919 filed on Nov. 28, 2013, which claims the benefit of Korean Patent Application No. 10-2013-0145165, filed on Nov. 27, 2013 and Korean Patent Application No. 10-2012-0138524, filed on Nov. 30, 2012, the disclosures of which are incorporated herein by reference.

TECHNICAL FIELD

The present invention relates to an anode active material for a lithium secondary battery and a preparation method thereof, and more particularly, to an anode active material including carbon-based particles; silicon nanowires grown on the carbon-based particles; and a carbon coating layer on surfaces of the carbon-based particles and the silicon nanowires, and a preparation method thereof.

BACKGROUND ART

Recently, in line with miniaturization, lightweight, thin profile, and portable trends in electronic devices according to the development of information and telecommunications industry, the need for high energy density batteries used as power sources of such electronic devices has increased. Currently, research into lithium secondary batteries, as batteries that may best satisfy the above need, has actively conducted.

Various types of carbon-based materials including artificial graphite, natural graphite, or hard carbon, which may intercalate/deintercalate lithium ions, have been used as an anode active material of a lithium secondary battery. Graphite among the above carbon-based materials has been most widely used, because it may provide advantages in terms of energy density of the lithium battery and may secure long lifetime of the lithium secondary battery due to its excellent reversibility.

However, since the graphite may have low capacity in terms of energy density per unit volume of an electrode and may facilitate a side reaction with an organic electrolyte solution at a high discharge voltage, there may be a risk of fire or explosion due to the malfunction and overcharging of the battery.

Therefore, a metal-based anode active material, such as silicon (Si), has been studied. It is known that a Si metal-based anode active material exhibits a high lithium capacity of about 4,200 mAh/g. However, a volume change of a maximum of 300% or more may occur before and after the reaction with lithium, i.e., during charge and discharge. As a result, there is a phenomenon in which the performance of the battery may degrade because a conductive network in the electrode may be damaged and contact resistance between particles may increase.

Thus, a method has been attempted, in which substantial changes in a diameter according to the volume change are reduced by decreasing the size of the silicon particles from a typical micron size to nanoscale. However, there may be many difficulties in a method of synthesizing a uniform nano silicon anode active material and uniformly distributing the nano silicon anode active material in a slurry.

In order to address such difficulties, nanowires, in addition to carbon nanotubes, have received attention as a nanomaterial that is the closest to commercialization as high-performance nanodevices, such as field effect transistors, photodetectors, chemical sensors and biosensors, nanoscale lasers, and light-emitting diodes (LEDs) using one-dimensional nanowires, begin to be realized.

As examples of such techniques, a method of forming nanowires by injecting silicon in a gas state and applying high heat or a method of growing nanowires by directly heating a silicon wafer has been developed. However, in these cases, the performance of the battery may degrade due to the detachment and weak electrical contact of the silicon nanowires during the preparation of the slurry or the operation of the battery.

Therefore, there is an urgent need to develop an anode active material for addressing the above limitations.

DISCLOSURE OF THE INVENTION

Technical Problem

The present invention provides an anode active material which may improve the performance of a secondary battery by increasing physical bonding force between carbon-based particles and silicon nanowires grown on the carbon-based particles as well as improving conductivity, and a preparation method thereof.

Technical Solution

According to an aspect of the present invention, there is provided an anode active material including carbon-based particles; silicon nanowires grown on the carbon-based particles; and a carbon coating layer formed on surfaces of the carbon-based particles and the silicon nanowires.

According to another aspect of the present invention, there is provided a method of preparing an anode active material including growing silicon nanowires on carbon-based particles by using a silicon raw material and a catalytic metal; and forming a carbon coating layer on surfaces of the silicon nanowires and the carbon-based particles on which the silicon nanowires are grown.

According to another aspect of the present invention, there is provided an anode including a current collector, and the anode active material formed at least one surface of the current collector.

According to another aspect of the present invention, there is provided a lithium secondary battery including a cathode, the anode, and a separator disposed between the cathode and the anode.

Advantageous Effects

Since an anode active material of the present invention, in which a carbon coating layer is formed on surfaces of carbon-based particles and silicon nanowires grown on the carbon-based particles, is used in a lithium secondary battery, conductivity may not only be improved but physical bonding force between the carbon-based particles and the silicon nanowires may also be further increased. Thus, lifetime characteristics of the battery may be improved.

BRIEF DESCRIPTION OF THE DRAWINGS

The following drawings attached to the specification illustrate preferred examples of the present invention by example, and serve to enable technical concepts of the present invention to be further understood together with detailed description of the invention given below, and therefore the present invention should not be interpreted only with matters in such drawings.

FIG. 1 is a schematic view illustrating an anode active material according to an embodiment of the present invention;

FIG. 6 is a graph illustrating discharge capacities of lithium secondary batteries of Example 2 and Comparative Example 2; and FIG. 7 is a graph illustrating coulombic efficiencies of the lithium secondary batteries of Example 2 and Comparative Example 2.

MODE FOR CARRYING OUT THE INVENTION

Figure 2A:
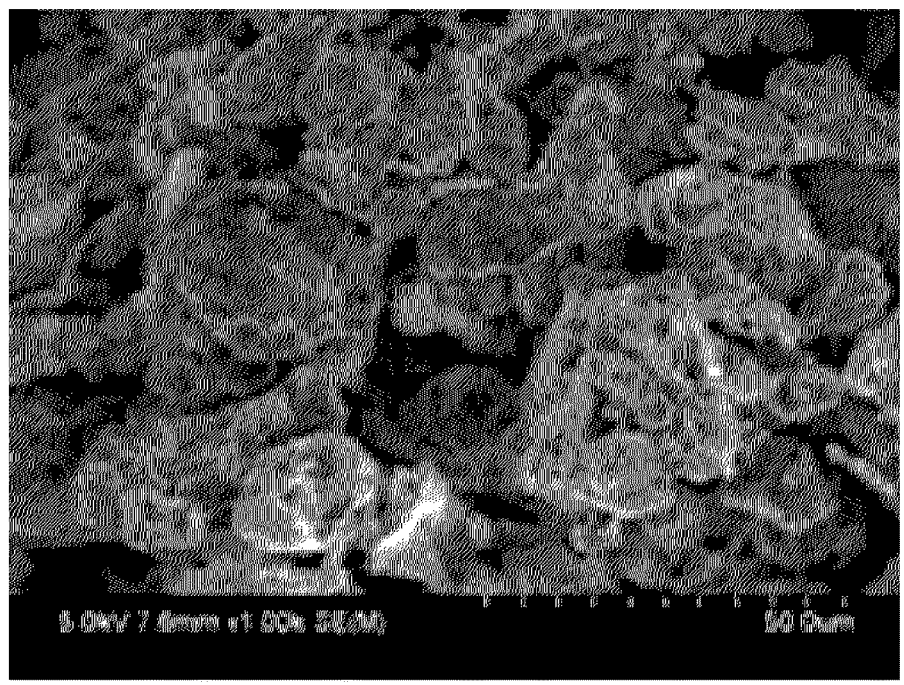
FIGS. 2A, 2B, 2C, 3A and 3B are scanning electron microscope (SEM) images of anode active materials respectively prepared in Comparative Example 1 and Example 1.

Hereinafter, the present invention will be described in more detail to allow for a clearer understanding of the present invention.

It will be understood that words or terms used in the specification and claims shall not be interpreted as the meaning defined in commonly used dictionaries. It will be further understood that the words or terms should be interpreted as having a meaning that is consistent with their meaning in the context of the relevant art and the technical idea of the invention, based on the principle that an inventor may properly define the meaning of the words or terms to best explain the invention.

An anode active material for a lithium secondary battery of the present invention may include carbon-based particles; silicon nanowires grown on the carbon-based particles; and a carbon coating layer formed on surfaces of the carbon-based particles and the silicon nanowires.

According to an embodiment of the present invention, the volume change generated during charge and discharge may be inhibited by directly growing silicon nanowires on carbon-based particles. In addition, since a bonding force between the silicon nanowires and the carbon-based particles may be further increased by forming a carbon coating layer on the surfaces of the carbon-based particles and the silicon nanowires, the detachment of the silicon nanowires may be prevented, and the performance of a battery may be further improved by providing conductivity.

Specifically, as a schematic view of an anode active material illustrated in FIG. 1, the anode active material according to an embodiment of the present invention may include silicon nanowires 11 grown on carbon-based particles 12 and a carbon coating layer 13 formed on surfaces of the silicon nanowires 11 and the carbon-based particles 12.

According to an embodiment of the present invention, the carbon coating layer 13 may be formed by partially or entirely coating the surfaces of the carbon-based particles and the silicon nanowires 11. However, since the formation of the carbon coating layer 13 by coating the entire surfaces of the carbon-based particles 12 and the silicon nanowires 11 may further increase the bonding force between the silicon nanowires 11 and the carbon-based particles 12 to prevent the detachment of the silicon nanowires 11, the performance of the secondary battery may be improved.

The carbon-based particles may have an average particle diameter ($D_{50}$) of 10 μm to 30 μm, a specific surface area of 2.0 m$^2$/g to 5.0 m$^2$/g, and a compressed density of 1.5 g/cc to 1.85 g/cc under a pressure of 12 MPa to 16 MPa.

In the present invention, the average particle diameter ($D_{50}$) of the carbon particles may be defined as a particle diameter at 50% in a cumulative particle diameter distribution. For example, the average particle diameter ($D_{50}$) of the carbon particles according to an embodiment of the present invention may be measured by using a laser diffraction method. The laser diffraction method may generally measure a particle diameter ranging from a submicron level to a few mm, and may obtain highly repeatable and high resolution results.

Also, the specific surface area of the carbon-based particles may be measured by a Brunauer-Emmett-Teller (BET) method. For example, the specific surface area may be measured by a 6-point BET method according to a nitrogen gas adsorption-flow method using a porosimetry analyzer (Belsorp-II mini by Bell Japan Inc.).

The silicon nanowire according to an embodiment of the present invention may be used as a concept that includes silicon in the form of a wire having a diameter in a nanometer range and a high aspect ratio regardless of the preparation method thereof. Therefore, a silicon nanorod or silicon nanotube may be included in the concept of the silicon nanowire.

According to an embodiment of the present invention, an amount of silicon in the silicon nanowires may be in a range of 5 wt % to 30 wt % based on a total weight of the carbon-based particles on which the silicon nanowires are grown. In the case that the amount of silicon is greater than the above range, since the excessive amount of silicon covers the carbon-based particles, the specific surface area may increase to accelerate a decomposition reaction of an electrolyte solution. In the case in which the amount of silicon is less than the above range, since silicon nanowires may not be grown entirely on the carbon-based particles, lifetime characteristics of the secondary battery may degrade.

The silicon nanowire according to the embodiment of the present invention may have a diameter ranging from about 10 nm to about 100 nm and a length ranging from about 100 nm to about 5 μm. Also, the nanowire may be linear or nonlinear, in which the nanowire may be curved or bent over the entire or partial length thereof. In general, although silicon (Si) exhibits high lithium capacity, Si may cause a volume change of 300% or more before and after the reaction with lithium, i.e., during charge and discharge. The volume change may be eliminated by directly growing nanowires three-dimensionally on the carbon-based particles.

However, in the carbon-based particles on which the nanowires are grown, the lifetime of the battery may be reduced due to the detachment and weak electrical contact of the silicon nanowires during the preparation of a slurry or the operation of the battery when the bonding force between the nanowires and the carbon-based particles is low.

Since the carbon coating layer is formed on the surfaces of the silicon nanowires grown on the carbon-based particles as well as the carbon-based particles, additional conductivity may be provided and simultaneously, the bonding between the carbon-based particles and silicon nanowires may be strengthened to prevent the detachment of the silicon nanowires from the carbon-based particles during the volume change according to charge and discharge. Thus, the present invention may provide excellent lifetime characteristics and charge and discharge capacity characteristics of the secondary battery.

Also, in the anode active material according to the embodiment of the present invention, a thickness of the carbon coating layer may be in a range of 5 nm to 50 nm. In the case that the thickness of the carbon coating layer is less than 5 nm, an effect of increasing electrical conductivity due to the carbon coating layer may be insignificant and the reactivity with the electrolyte solution during the application of the anode active material may be high. Thus, an initial efficiency may be reduced. In the case in which the thickness of the carbon coating layer is greater than 50 nm, since the thickness of the carbon coating layer may be excessively increased to act as a barrier to the mobility of lithium ions, resistance may increase.

A method of preparing an anode active material according to an embodiment of the present invention will be described in detail as follows:

That is, the method of preparing an anode active material according to the embodiment of the present invention may include growing silicon nanowires on carbon-based particles by using a silicon raw material and a catalytic metal (step i); and forming a carbon coating layer on surfaces of the silicon nanowires and the carbon-based particles on which the silicon nanowires are grown (step ii).

In the growing of the silicon nanowires (step i) according to an embodiment of the present invention, a method of growing silicon nanowires may be a typical method known in the art, and for example, may be a method selected from the group consisting of a vapor-liquid-solid phase (VLS) method, a solid-liquid-solid (SLS) method, a metal organic chemical vapor deposition (MOCVD) method, and a molecular beam epitaxy (MBE) method. For example, the method of growing silicon nanowires may be the VLS method.

The silicon raw material for growing the silicon nanowires may include $SiCl_4$, $SiH_4$, or a mixture thereof.

The catalytic metal may be a seed of the growth of a nanostructure, and may be the form of a metal thin film or metal powder. The metal thin film, for example, may have a thickness of about 1 Å to about 1,000 nm, and the metal powder, for example, may have a diameter of 1 nm to 1,000 nm. However, the present invention is not particularly limited thereto. A type of the catalytic metal may include a metal that may decrease a melting point of silicon. Examples of the catalytic metal may include any one selected from the group consisting of gold (Au), iron (Fe), silver (Ag), and nickel (Ni), or a mixed metal of two or more thereof.

Also, in order to provide surface conductivity to the carbon-based particles on which the silicon nanowires are grown and strengthen the physical bonding force between the silicon nanowires and the carbon-based particles, a carbon coating layer may be formed on the surfaces of the carbon-based particles on which the silicon nanowires are grown (step ii).

According to an embodiment of the present invention, the carbon coating layer may be formed by coating the carbon-based particles on which the silicon nanowires are grown with a carbon precursor and performing a heat treatment.

Any carbon precursor may be used without limitation so long as it may form carbon by a heat treatment, and for example, the carbon precursor may include gas including carbon or amorphous carbon. Specifically, the amorphous carbon may include any one selected from the group consisting of glucose, fructose, galactose, maltose, lactose, sucrose, a phenol-based resin, a naphthalene resin, a polyvinyl alcohol resin, an urethane resin, a polyimide resin, a furan resin, a cellulose resin, an epoxy resin, a polystyrene resin, a resorcinol-based resin, a phloroglucinol-based resin, a coal-derived pitch, a petroleum-derived pitch, and a tar, or a mixture of two or more thereof.

According to an embodiment of the present invention, in the case that a coal-derived pitch or petroleum-derived pitch is used as the amorphous carbon, a weight-average molecular weight (Mw) of the pitch may be in a range of 200 to 3,000. When the weight-average molecular weight of the pitch is greater than 3,000, the dispersion of a solvent may be difficult, and thus, uniform pitch coating may not be performed. When the weight-average molecular weight of the pitch is less than 200, a yield during the pitch coating may decrease and a uniform coating layer may be difficult to be obtained. Also, in order to perform uniform coating by allowing the pitch to penetrate gaps between the silicon nanowires, the weight-average molecular weight of the pitch may be in a range of 400 to 1,500, more preferably, 500 to 800.

Furthermore, according to an embodiment of the present invention, a mixing ratio of the carbon-based particles on which the silicon nanowires are grown to the carbon precursor (e.g., amorphous carbon) is in a range of 90 parts by weight:10 parts by weight to 99 parts by weight:1 part by weight, more preferably, 90 parts by weight:10 parts by weight to 95 parts by weight:5 parts by weight. In the case that the weight of the carbon precursor is less than 1 part by weight, since a total coating amount is insufficient, the bonding force between the carbon-based particles and the silicon nanowires may not only be decreased but uniform coating may also be difficult to be obtained. In the case in which the weight of the carbon precursor is greater than 10 parts by weight, powder may be agglomerated after carburization due to the aggregation of the particles.

For example, a method of carburizing the amorphous carbon precursor may be used in the coating. A dry or wet coating method may be used as the coating method. Also, a deposition method, for example, a chemical vapor deposition (CVD) method using gas including carbon, such as methane, ethane, propane, ethylene, and acetylene, may be used to form the carbon coating layer.

According to an embodiment of the present invention, the wet coating method, for example, may be performed by dipping the carbon-based particles on which the silicon nanowires are grown in an organic solvent in which amorphous carbon is diluted. In the case that the wet coating is used according to the embodiment of the present invention, the carbon-based particles on which the silicon nanowires are grown and the amorphous carbon, for example, are mixed with a mixer or mortar, and wet coating is then performed by dipping the mixture thus prepared in a solvent, i.e., any one selected from the group consisting of ethanol, toluene, methanol, hexane, acetone, tetrahydrofuran, pyridine, quinoline, and benzoquinone, or a mixture of two or more thereof. Then, a heat treatment may be performed.

According to an embodiment of the present invention, the heat treatment may be performed in an inert atmosphere. The heat treatment is performed at a temperature ranging from 300° C. to 1,500° C. and may be performed at a temperature ranging preferably from 300° C. to 800° C., more preferably from 300° C. to 500° C. for 5 hours to 10 hours. In the case that the temperature of the heat treatment is less than 300° C., since a residual organic or inorganic material may remain, the resistance of the coating layer may increase. Also, since a desirable solid electrolyte interface (SEI) layer may not be formed, the initial efficiency related to the battery performance may be reduced. In the case in which the temperature of the heat treatment is greater than 1,500° C., processing costs may increase.

The carbon-based particles and the silicon nanowires may be entirely uniformly or non-uniformly coated with the carbon coating layer, and the carbon coating layer may be formed to cover a portion or the entirety of the carbon-based particles and the silicon nanowires. A thickness of the coating layer is not particularly limited. However, the thickness thereof may be in a range of 5 nm to 50 nm, preferably, 5 nm to 20 nm.

Also, the present invention may include a current collector, and an anode including the anode active material that is formed on at least one surface of the current collector.

According to an embodiment of the present invention, the anode may be prepared by a preparation method typically used in the art. Also, similar to the anode, a cathode, according to an embodiment of the present invention, may be prepared by a typical method in the art.

For example, cathode active material and anode active material of the present invention are mixed with a binder, a solvent, and a conductive agent and a dispersant if necessary, and stirred to prepare a slurry. Then, a current collector may be coated with the slurry and pressed to prepare an electrode.

Various types of binder polymers, such as a polyvinylidene fluoride-hexafluoropropylene copolymer (PVDF-co-HEP), polyvinylidene fluoride, polyacrylonitrile, and polymethylmethacrylate, may be used as the binder that is used in the present invention.

Lithium-containing transition metal oxide may be used as the cathode active material. For example, any one selected from the group consisting of $Li_xCoO_2$ ($0.5<x<1.3$), $Li_xNiO_2$ ($0.5<x<1.3$), $Li_xMnO_2$ ($0.5<x<1.3$), $Li_xMn_2O_4$ ($0.5<x<1.3$), $Li_x(Ni_aCo_bMn_c)O_2$ ($0.5<x<1.3$, $0<a<1$, $0<b<1$, $0<c<1$, $a+b+c=1$), $Li_xNi_{1-y}Co_yO_2$ ($0.5<x<1.3$, $0<y<1$), $Li_xCo_{1-y}Mn_yO_2$ ($0.5<x<1.3$, $0\leq y<1$), $Li_xNi_{1-y}Mn_yO_2$ ($0.5<x<1.3$, $0\leq y<1$), $Li_x(Ni_aCo_bMn_c)O_4$ ($0.5<x<1.3$, $0<a<2$, $0<b<2$, $0<c<2$, $a+b+c=2$), $Li_xMn_{2-z}Ni_zO_4$ ($0.5<x<1.3$, $0<z<2$), $Li_xMn_{2-z}Co_zO_4$ ($0.5<x<1.3$, $0<z<2$), $Li_xCoPO_4$ ($0.5<x<1.3$), and $Li_xFePO_4$ ($0.5<x<1.3$), or a mixture of two or more thereof may be used. The lithium-containing transition metal oxide may be coated with a metal, such as aluminum (Al), or a metal oxide. Also, sulfide, selenide, and halide may be used in addition to the lithium-containing transition metal oxide.

When the electrode is prepared, the electrode may be used to prepare a lithium secondary battery including a separator and an electrolyte solution which are typically used in the art and disposed between the cathode and the anode.

In the electrolyte solution used in the present invention, a lithium salt, which may be included as an electrolyte, may be used without limitation so long as it is typically used in an electrolyte solution for a lithium secondary battery. For example, any one selected from the group consisting of $F^-$, $Cl^-$, $Br^-$, $I^-$, $NO_3^-$, $N(CN)_2^-$, $BF_4^-$, $ClO_4^-$, $PF_6^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$, and $(CF_3CF_2SO_2)_2N^-$ may be used as an anion of the lithium salt.

In the electrolyte solution used in the present invention, an organic solvent included in the electrolyte solution may be used without limitation so long as it is typically used in the electrolyte solution for a lithium secondary battery. Typically, any one selected from the group consisting of propylene carbonate (PC), ethylene carbonate (EC), diethyl carbonate (DEC), dimethyl carbonate (DMC), ethylmethyl carbonate (EMC), methylpropyl carbonate, dipropyl carbonate, dimethyl sulfoxide, acetonitrile, dimethoxyethane, diethoxyethane, vinylene carbonate, sulfolane, γ-butyrolactone, propylene sulfite, and tetrahydrofuran, or a mixture of two or more thereof may be used. In particular, ethylene carbonate and propylene carbonate, ring-type carbonates among the carbonate-based organic solvents, well dissociate the lithium salt in the electrolyte solution due to high dielectric constants as high-viscosity organic solvents, and thus, the ring-type carbonate may be used. Since an electrolyte solution having high electrical conductivity may be prepared when the ring-type carbonate is mixed with low-viscosity, low-dielectric constant linear carbonate, such as dimethyl carbonate and diethyl carbonate, in an appropriate ratio, the ring-type carbonate, for example, may be used.

Selectively, the electrolyte solution stored according to the present invention may further include an additive, such as an overcharge inhibitor, which is included in a typical electrolyte solution.

A typical porous polymer film used as a typical separator, for example, a porous polymer film prepared from a polyolefin-based polymer, such as an ethylene homopolymer, a propylene homopolymer, an ethylene/butene copolymer, an ethylene/hexene copolymer, and an ethylene/methacrylate copolymer, may be used alone or in a lamination therewith as the separator. Also, a typical porous nonwoven fabric, for example, a nonwoven fabric formed of high melting point glass fibers or polyethylene terephthalate fibers may be used. However, the separator is not limited thereto.

A shape of the lithium secondary battery of the present invention is not particularly limited, and for example, a cylindrical type using a can, a prismatic type, a pouch type, or a coin type may be used.

Hereinafter, the present invention will be described in detail, according to specific examples. The invention may, however, be embodied in many different forms and should not be construed as being limited to the embodiments set forth herein. Rather, these example embodiments are provided so that this description will be thorough and complete, and will fully convey the scope of the present inventive concept to those skilled in the art.

EXAMPLES

Hereinafter, the present invention will be described in more detail, according to examples and experimental examples. However, the present invention is not limited thereto.

<Preparation of Anode Active Material>

Example 1

Gold (Au) was disposed on graphite particles having an average particle diameter ($D_{50}$) of about 20 μm and the graphite particles and Au were put in a batch type reactor. A temperature of the reactor was maintained at about 400° C., and a VLS reaction was then performed while flowing $SiH_4$ as a reaction gas by using argon (Ar) as a carrier gas. As a result, silicon nanowires having a diameter of 10 nm to 100 nm and a length of 2 μm were grown on the graphite particles. A weight of the silicon nanowires may be controlled according to a reaction time. In the present example, a weight ratio of graphite to silicon nanowires was 92 wt %:8 wt %.

Wet coating was performed by dipping the graphite on which silicon nanowires were grown in ethanol in which coal-derived pitch was diluted (6 wt % pitch-ethanol solution), and a heat treatment was then performed at 400° C. in an argon atmosphere to prepare an anode active material including a carbon coating layer on surfaces of graphite on which silicon nanowires were grown and the silicon nanowires.

Comparative Example 1

An anode active material was prepared in the same manner as in Example 1 except that a carbon coating layer was not formed on graphite particles on which silicon nanowires are grown. A weight ratio of graphite to silicon nanowires was 92 wt %:8 wt %.

<Preparation of Lithium Secondary Battery>

Example 2

The anode active material prepared in Example 1, a styrene-butadiene rubber (SBR) as a binder, carboxymethyl cellulose (CMC) as a thickener, and acetylene black as a conductive agent were mixed at a weight ratio of 95:2:2:1 and the mixture thus obtained was mixed with water as a solvent to prepare a uniform anode slurry. One surface of a copper current collector was coated with the prepared anode slurry to a thickness of 65 μm, dried and rolled. Then an anode was prepared by punching into a predetermined size.

Ethylene carbonate (EC) and diethyl carbonate (DEC) were mixed at a volume ratio of 30:70, and $LiPF_6$ was added to the non-aqueous electrolyte solvent thus prepared to prepare a 1 M $LiPF_6$ non-aqueous electrolyte solution.

Also, a lithium foil was used as a counter electrode, i.e. a cathode, a polyolefin separator was disposed between both electrodes, and a coin-type lithium secondary battery was then prepared by injecting the electrolyte solution.

Comparative Example 2

A coin-type lithium secondary battery was prepared in the same manner as in Example 2 except that the anode active material prepared in Comparative Example 1 was used.

Experimental Example 1

<Scanning Electron Microscope (SEM) Images: Identification of Carbon Coating Layer Formation>

SEM analysis was respectively performed on the anode active materials prepared in Comparative Example 1 and Example 1 to identify the degree of growth of silicon nanowires, and the results thereof are respectively presented in FIGS. 2A, 2B, 2C, 3A and 3B.

Figure 2B:
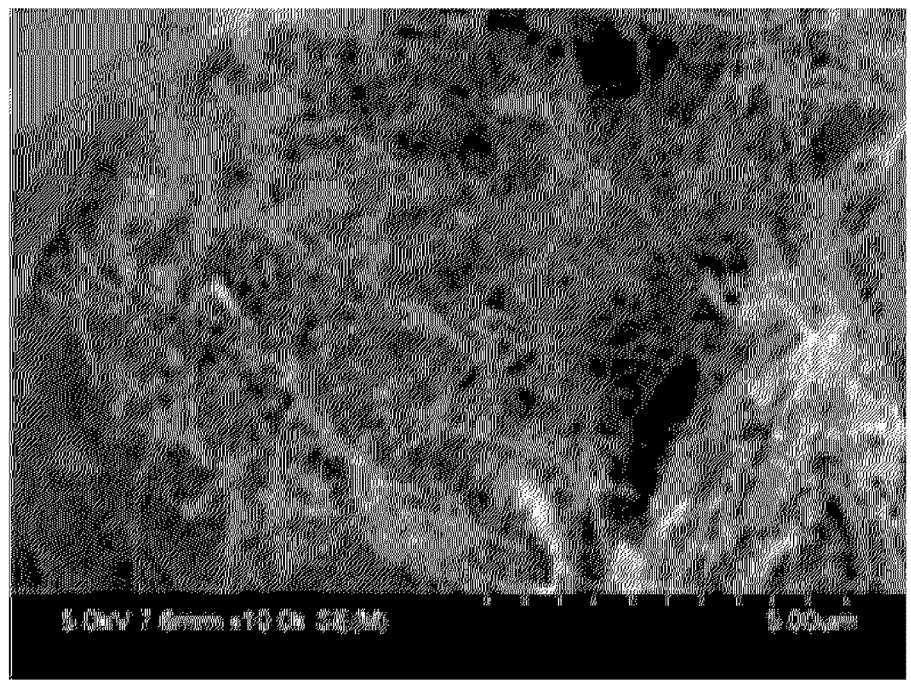
Figure 2C:
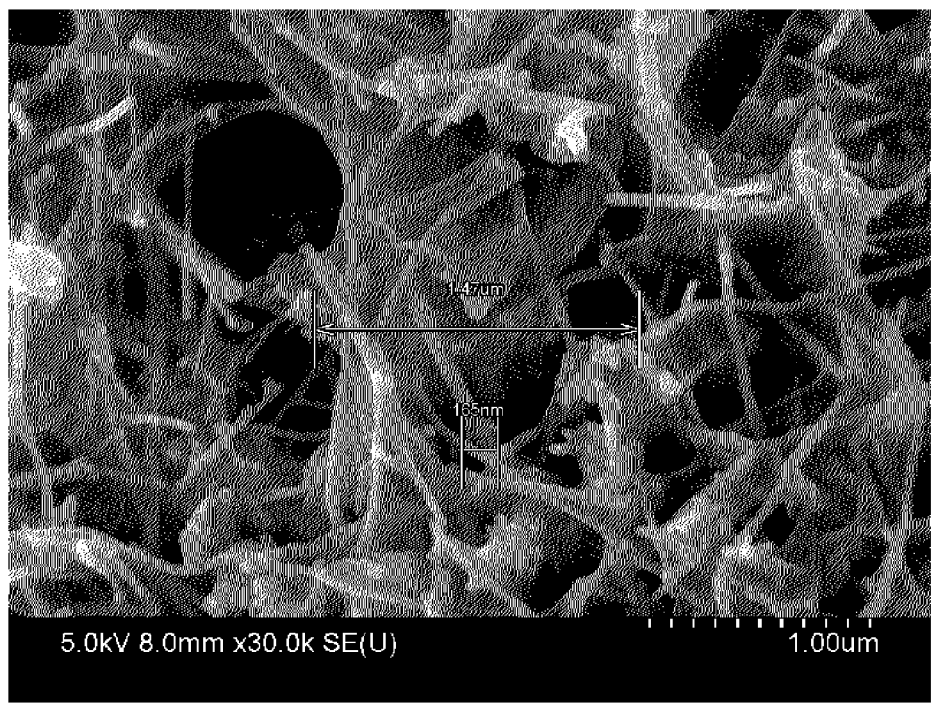
Figure 3A:
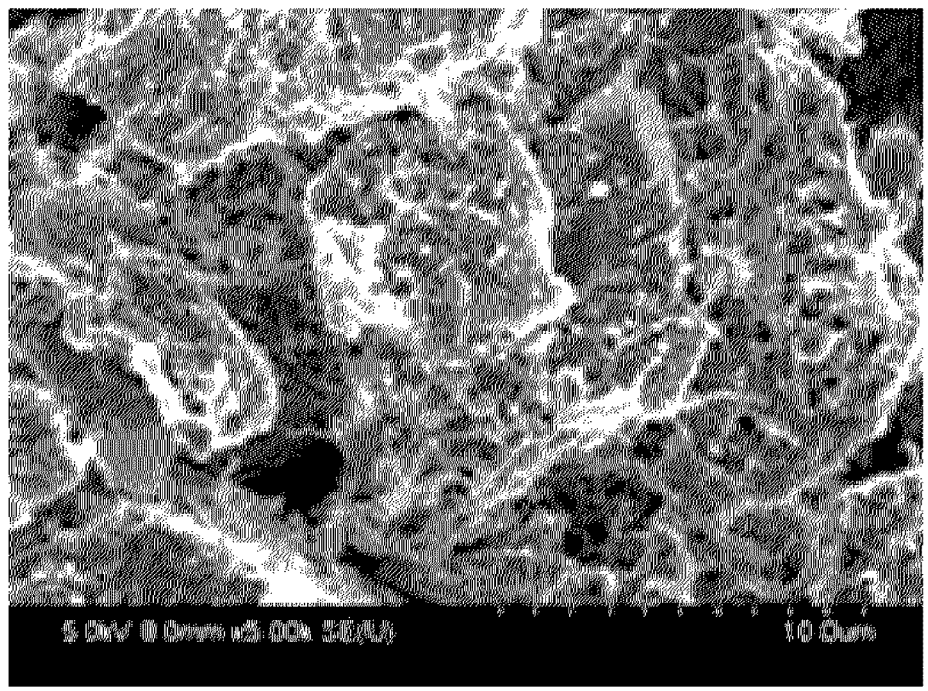
Figure 3B:
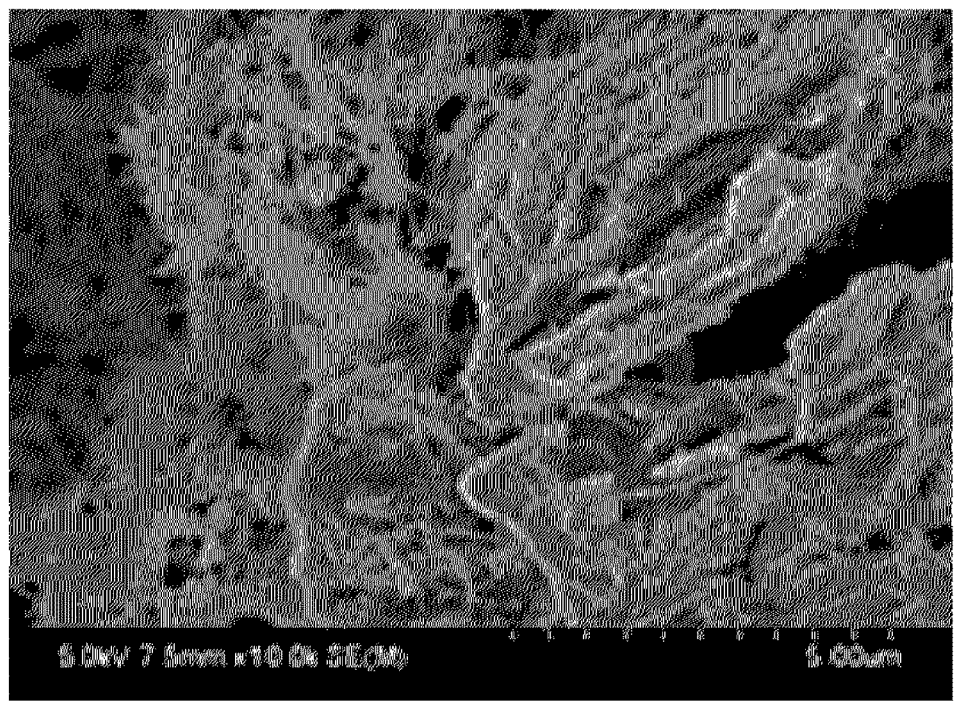

Specifically, FIGS. 2A to 2C illustrate SEM images of a surface of the anode active material with no carbon coating layer that is prepared in Comparative Example 1 according to magnification, and FIGS. 3A and 3B illustrate SEM images of a surface of the anode active material including a carbon coating layer that is prepared in Example 1 according to magnification.

As illustrated in FIGS. 2A, 2B, 2C, 3A and 3B, it may be identified that silicon nanowires were grown on graphite particles in both of Example 1 and Comparative Example 1. In particular, as illustrated in FIGS. 3A and 3B, it may be identified that the carbon coating layer was included on all of the graphite particles and silicon nanowires.

In contrast, when a high magnification image of FIG. 2C was examined, it may be identified that silicon nanowires were grown on carbon-based particles, but a carbon coating layer was not formed.

Experimental Example 2

<SEM Images: Identification of Physical Bonding Force Between Carbon-Based Particles and Silicon Nanowires>

The anode active materials prepared in Comparative Example 1 and Example 1 were respectively diluted at 1 g/mL in water, ethanol, and toluene, and stirred at 60° C. for 12 hours. Then, degrees in which silicon nanowires remained in each solvent were identified by SEM images, and the results thereof are presented in FIGS. 4 and 5.

Figure 4:
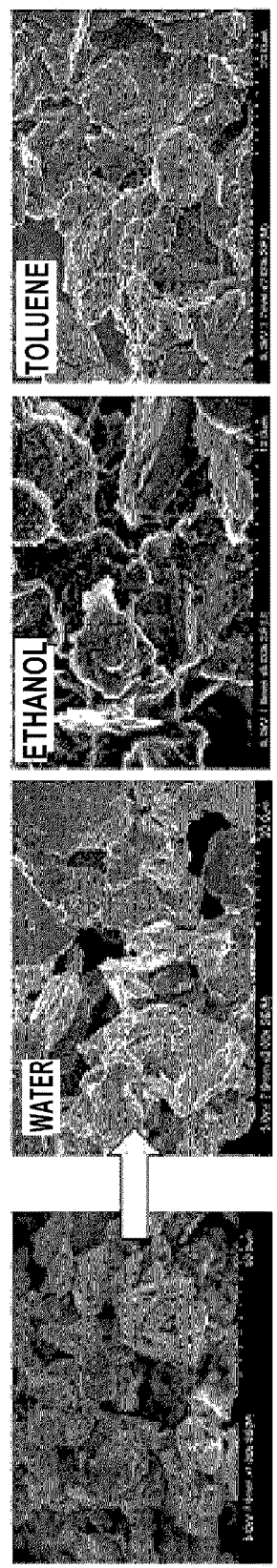
FIGS. 4 and 5 are SEM images for respectively identifying degrees in which silicon nanowires remain after diluting the anode active materials of Comparative Example 1 and Example 1 in water, ethanol, and toluene.

As illustrated in FIG. 4, with respect to Comparative Example 1 with no carbon coating layer, it may be identified that a portion of the silicon nanowires was detached after being diluted in water, and it may be also identified that most of the silicon nanowires were detached from the graphite particles in ethanol and toluene so that the silicon nanowires almost did not remain on the graphite particles.

Figure 5:
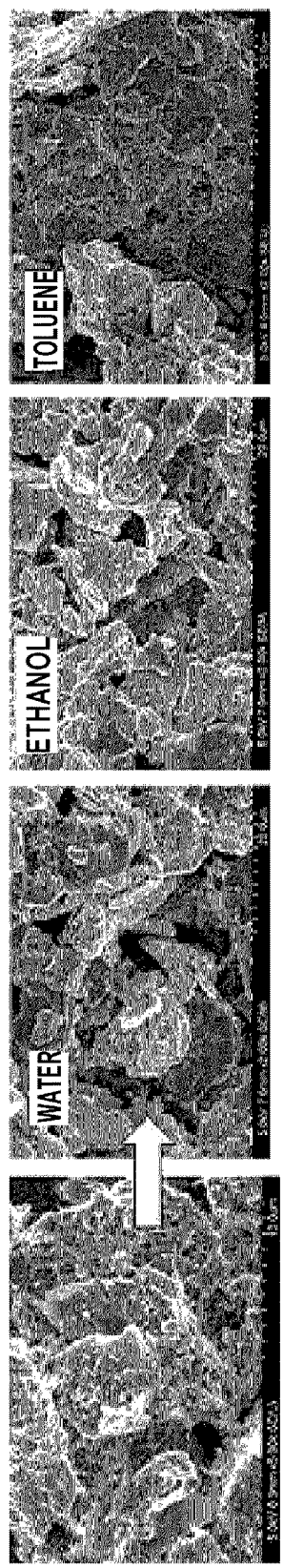

In contrast, as illustrated in FIG. 5, with respect to the anode active material of Example 1, it may be identified that the silicon nanowires were combined with the graphite particles and remained intact in water, toluene, and ethanol.

Thus, it may be understood that the physical bonding force between the carbon-based particles and the silicon nanowires were strengthened by including the carbon coating layer on the carbon-based particles and the silicon nanowires grown thereon.

Experimental Example 3

<Cycle Characteristics>

Charge and discharge characteristics were evaluated for the lithium secondary batteries of Example 2 and Comparative Example 2 by using a charge and discharge machine (WBCS 3000 by WONA TECH).

The lithium secondary batteries (battery capacity: 3.4 mAh) prepared in Example 2 and Comparative Example 2 were charged at a constant current (CC) of 0.1 C to a voltage of mV, and thereafter, charge in the first cycle was performed by charging the lithium secondary batteries at a constant voltage (CV) to a current of 0.17 mAh. After the batteries were left standing for 10 minutes, discharge capacities in the first cycle were measured by discharging the batteries at a constant current of 0.1 C to a voltage of 1 V. Subsequently, with respect to each battery of Example 2 and Comparative Example 2, the charge and discharge were repeated 100 cycles to measure discharge capacity for each cycle. The results thereof are presented in FIG. 6.

As illustrated in FIG. 6, with respect to Comparative Example 2, the capacity was decreased from a $50^{th}$ cycle and was decreased to 50% or more in a $100^{th}$ cycle. In contrast, with respect to Example 2, it may be understood that the capacity was almost unchanged up to a $60^{th}$ cycle and remained almost unchanged even up to the $100^{th}$ cycle.

Also, as illustrated in FIG. 7, with respect to Comparative Example 2, a coulombic efficiency was decreased as the number of cycles increased. In contrast, with respect to Example 2, an initial coulombic efficiency was similar to that of Comparative Example 2. However, the coulombic efficiency was increased as the number of cycles increased, and a coulombic efficiency of up to 99.99% was obtained in the $100^{th}$ cycle.

This indicated that since the prepared silicon nanowires were not damaged and remained intact on the graphite particles due to the carbon coating layer, the lifetime of the battery may be improved.

INDUSTRIAL APPLICABILITY

Since an anode active material according to an embodiment of the present invention may not only improve conductivity but may also further increase the physical bonding force between carbon-based particles and silicon nanowires, lifetime characteristics of a secondary battery may be improved. Thus, the anode active material may be suitable for secondary batteries.

The invention claimed is:

1. An anode active material comprising:
   carbon-based particles;
   silicon nanowires grown on the carbon-based particles; and
   a carbon coating layer formed on surfaces of the carbon-based particles and the silicon nanowires,
   wherein a thickness of the carbon coating layer is in a range of 5 nm to 20 nm, and
   the carbon coating layer covers the entire surfaces of the carbon-based particles and the silicon nanowires.

2. The anode active material of claim 1, wherein the carbon-based particles comprises any one selected from the group consisting of carbon-based powder, carbon black, natural graphite, artificial graphite, and a mixture of two or more thereof.

3. The anode active material of claim 1, wherein an average particle diameter of the carbon-based particles is in a range of 10 μm to 30 μm,
   wherein the average particle diameter of the carbon-based particles is a particle diameter at 50% in a cumulative particle diameter distribution.

4. The anode active material of claim 1, wherein a specific surface area of the carbon-based particles is in a range of 2.0 $m^2/g$ to 5.0 $m^2/g$, and a compressed density of the carbon-based particles is in a range of 1.5 g/cc to 1.85 g/cc under a pressure of 12 MPa to 16 MPa,
   wherein the specific surface area of the carbon-based particles is measured by a Brunauer-Emmett-Teller (BET) method.

5. The anode active material of claim 1, wherein the silicon nanowire has a diameter ranging from 10 nm to 100 nm and a length ranging from 100 nm to 5 μm.

6. The anode active material of claim 1, wherein an amount of silicon is in a range of 5 wt % to 30 wt % based on a total weight of the carbon-based particles and the silicon nanowires grown on the carbon-based particles.

7. An anode comprising a current collector, and the anode active material of claim 1 formed at least one surface of the current collector.

8. A lithium secondary battery comprising a cathode, the anode of claim 7, and a separator disposed between the cathode and the anode.

9. A method of preparing an anode active material, the method comprising:
   growing silicon nanowires on carbon-based particles by using a silicon raw material and a catalytic metal; and
   forming a carbon coating layer on surfaces of the silicon nanowires and the carbon-based particles on which the silicon nanowires are grown,
   wherein a thickness of the carbon coating layer is in a range of 5 nm to 20 nm,
   wherein the carbon coating layer is formed by coating the carbon-based particles on which the silicon nanowires are grown with a carbon precursor and performing a heat treatment,
   wherein the carbon precursor comprises gas or amorphous carbon, and the gas includes carbon, and
   wherein the amorphous carbon is a coal-derived pitch or a petroleum-derived pitch, and the coal-derived pitch and the petroleum-derived pitch have a weight-average molecular weight ranging from 500 to 800.

10. The method of claim 9, wherein the growing of the silicon nanowires is performed by a method selected from the group consisting of a vapor-liquid-solid (VLS) method, a solid-liquid-solid (SLS) method, a metal organic chemical vapor deposition (MOCVD) method, and a molecular beam epitaxy (MBE) method.

11. The method of claim 9, wherein the silicon raw material comprises $SiCl_4$, $SiH_4$, or a mixture thereof.

12. The method of claim 9, wherein the catalytic metal comprises any one selected from the group consisting of gold (Au), iron (Fe), silver (Ag), nickel (Ni), and a mixed metal of two or more thereof.

13. The method of claim 9, wherein a mixing ratio of the carbon-based particles and the silicon nanowires grown on the carbon-based particles to the carbon precursor is in a range of 90 parts by weight:10 parts by weight to 99 parts by weight:1 part by weight.

14. The method of claim 9, wherein the heat treatment is performed at a temperature ranging from 300° C. to 1,500° C.

15. The method of claim 9, wherein the coating is performed by a dry or wet coating method using an amorphous carbon precursor, or a chemical vapor deposition (CVD) method using the gas.

16. The method of claim 15, wherein the wet coating method is performed by dipping the carbon-based particles on which the silicon nanowires are grown in an organic solvent in which the amorphous carbon that is prepared from the amorphous carbon precursor is diluted.

17. The method of claim 16, wherein the organic solvent comprises any one selected from the group consisting of ethanol, toluene, methanol, hexane, acetone, tetrahydrofuran, pyridine, quinoline, benzoquinone, and a mixture of two or more thereof.

* * * * *